United States Patent [19]

Fong

[11] Patent Number: 5,798,723
[45] Date of Patent: Aug. 25, 1998

[54] ACCURATE AND PRECISE CURRENT MATCHING FOR LOW VOLTAGE CMOS DIGITAL TO ANALOG CONVERTERS

[75] Inventor: Edison Fong, Sunnyvale, Calif.

[73] Assignee: National Semiconductor Corporation, Santa Clara, Calif.

[21] Appl. No.: 684,171

[22] Filed: Jul. 19, 1996

[51] Int. Cl.$^6$ .................................................. H03M 1/66
[52] U.S. Cl. ........................ 341/136; 341/153; 323/315
[58] Field of Search ................................ 341/133, 134, 341/135, 136, 144, 153; 323/315, 316

[56] References Cited

U.S. PATENT DOCUMENTS

| | | | |
|---|---|---|---|
| 5,235,218 | 8/1993 | Matsuo et al. | 323/316 |
| 5,331,322 | 7/1994 | Cha et al. | 341/136 |
| 5,373,294 | 12/1994 | Sun | 341/136 |
| 5,581,174 | 12/1996 | Fronen | 323/316 |
| 5,646,518 | 7/1997 | Lakshmikumar et al. | 323/316 |

OTHER PUBLICATIONS

Yasuyuki Nakamura, Takahiro Miki, Atsushi Maeda, Harufusa Kondoh and Nobuharu Yazawa, "A 10–b 70–MS/s CMOS D/A Converter", Journal of Solid–State Circuits, vol. 26, No. 4, Apr. 1991, pp. 637–642.

Harold Shichman and David A. Hodes, "Modeling and Simulation of Insulated–Gate Field–Effect Transistor Switching Circuits", Journal of Solid–State Circuits, vol. SC–3, No. 3, Sep. 1968, pp. 285–289.

Takahiro Miki, Yasuyuki Nakamura, Masao Nakaya, Sotoju Asai, Yoichi Akasaka, and Yasutaka Horiba, "An 80–MHz 8–bit CMOS D/A Converter", Journal of Solid–State Circuits, vol. SC–21, No. 6, Dec. 1986, pp. 983–988.

Vivian W–K Shen and David A. Hodges, "A 60ns Glitch-Free NMOS DAC", IEEE International Solid–State Circuits Conference, Feb. 24, 1983, pp. 188–189.

Hae–Seung Lee and David A. Hodges, "Self–Calibration Technique for A/D Converters", IEEE Transactions on Circuits and Systems, vol. CAS–30, No. 3, Mar. 1983, pp. 188–190.

Primary Examiner—Howard L. Williams
Attorney, Agent, or Firm—Limbach & Limbach L.L.P.

[57] ABSTRACT

An operational amplifier in a bias voltage generator of a MOS current summing digital to analog converter corrects deviations in output current due to variations in drain to source voltages in current slaves caused by differing output resistances and supply voltages. Matching of MOS current sources uses an operational amplifier feedback circuit to create a controlled turn-on reference voltage used for biasing selected differential current paths so as to eliminate drain to source voltage variations in precisely ratioed current slave MOS transistors. One transistor of each differential current pair is enabled by a corresponding switch coupled to the turn-on reference voltage produced by the operational amplifier. In the preferred embodiment, the switches are CMOS transmission gates enabled by the binary digital input and its complement. Low voltage (3 volts) operation is achieved by having minimum number of stacked transistors between power supply voltages. Reliable current matching allows converter resolution of 10 bits. Due to cascode switching action controlling alternative differential current paths, output current is independent of output resistance. The operational amplifier samples the current bias reference used to bias the binary ratioed slaves and the drain of a current mirror and drives a feedback transistor gate and the enabled differential current paths with the turn-on reference voltage so that the precisely ratioed current slaves have the same drain to source voltage as the reference current transistor. The reference voltages produced are thereby independent of supply voltages and process.

18 Claims, 6 Drawing Sheets

ACCURATE AND PRECISE CURRENT MATCHING FOR LOW VOLTAGE CMOS DIGITAL TO ANALOG CONVERTERS

BACKGROUND OF THE INVENTION

1. Field of the Invention

The present invention relates to low voltage digital to analog converters. Specifically, the present invention relates to current summing converters implemented in MOS technologies.

2. Discussion of the Related Art

One of the most important aspects in the design and manufacturing of data acquisition products is the availability of high precision components. For example, video displays often are controlled by R, G, and B signals (Red, Green, and Blue Signals) which are analog voltages produced by digital to analog converters. The inputs to the digital to analog converters are the digitally encoded display data. In order to display image data with the precision at which it is encoded with minimum power, it is important for the digital to analog converter to be as accurate as possible. Virtually all data conversion products are therefore based on some type of binary weighted precision element or precisely controlled time.

In the case of digital to analog converters, transistors themselves can be used as the binary weighted component. Numerous designs using both bipolar as well as MOS technologies have used transistors as the weighted components. However, without some form of error correction, the use of MOS transistors as binary weighted current sources provides an analog output only accurate to at most eight bits of precision. In other words, the output voltage is only accurate to within one two-hundred-fifty-sixth of the overall output voltage swing.

Current summing digital to analog converters are popular due to their high speed characteristics and simplicity which make them ideal for video applications. A current summing digital to analog converter is essentially the reverse of the popular "flash" approach used in analog to digital converters. Both the current summing and flash architectures are limited to the propagation delay of the logic and settling time at the output. The conventional current summing and flash configurations are asynchronous, thus there are no clocks and the noise is primarily due to the logic switching. The logic in these architectures is usually straightforward because the conversions are performed in one step. Because the architecture is asynchronous, the noise is dependent on the input code. This contrasts with synchronous type converters (successive approximation register, constant slope, etc.) in which output noise is correlated with the system clock.

In conventional current summing topology, the precision in the matching of the currents becomes the limiting factor in the resolution of the converter. Unfortunately, the matching of currents is primarily dependent on two factors: the W/L ratio and drain-to-source voltage ($V_{ds}$). The practical limitation for conventional current summing techniques allows at most eight bit digital numbers to be accurately converted into analog.

In contrast, in charge redistribution type converters, the precision of the matching is only dependent on the area of the capacitor. Therefore, charge redistribution types of converters can achieve accuracy to within twelve bits of resolution without any error correction. However, the primary disadvantage of the charge redistribution algorithm is that the maximum speed is limited to only several MHz. Therefore, the charge redistribution converters are not practical for many video applications.

For high speed applications, the more conventional current summing approach is favored as illustrated in FIG. 1. In the circuit of FIG. 1, the unit current is given the value I and is increased in a binary weighted fashion. Depending on the binary code, the binary weighted currents are then switched either to the current outputs $V_{OUT}$ 111 or $\overline{V_{OUT}}$ 112 which are then summed at the output and forced through resistors to produce an output analog voltage.

FIG. 1 illustrates a conventional MOS current summing digital to analog converter 100. A reference current $I_{REF}$ 101 is generated and draws current through a reference current transistor 102. The reference current transistor 102 is connected such that the drain and gate are connected. Thus, the reference current transistor 102 acts as the master of several current mirrors. This allows the gate of the reference current transistor 102 to settle to whatever voltage is necessary to bias the reference current transistor 102 in saturation such that a current of $I_{REF}$ flows through it. The gate of the reference current transistor 102 is a reference voltage 117 which is distributed to several slave transistors. In FIG. 1, two slave transistors 103 and 104 are illustrated. If the slave transistor 103 has the same channel width divided by channel length ratio (W/L) as the master transistor 102, then the drain current I of the slave transistor 103 equals $I_{REF}$ from the current source 101.

The digital to analog converter 100 illustrated in FIG. 1 is designed to convert an n+1 bit binary number having most significant binary digit bn and least significant binary digit b0 into an analog voltage $V_{OUT}$ 111 and its analog compliment $\overline{V_{OUT}}$ 112. Thus, the n+1 bit binary input code assumes a value of any integer between zero and $2^{n+1}-1$, inclusive. By construction, the least significant input bit is subscripted with zero rather than one, resulting in an n+1 bit (rather than n bit) binary input number. The most significant digital input bit is bn 115 and its compliment is $\overline{bn}$ 116. The least significant digital input bit is b0 113 and its compliment is $\overline{b0}$ 114. A variable number of intermediate digital input bits which are not illustrated in FIG. 1, but whose existence is alluded to by the dashed lines connecting the least significant and most significant current stages. Because the binary digital input codes are weighted by various powers of two, the most significant current stage which is controlled by the binary digital input bn and is supplied by the slave current through transistor 104, the drain current through the most significant weighted current slave transistor 104 is $I*2^n$.

Each weighted current slave transistor 103 and 104 illustrated in FIG. 1 is biased with a constant current. For example, the current I through the weighted current slave transistor 103 is conducted either through the non-inverting differential transistor 105 which is controlled by b0, or through the inverting differential transistor 106 which is controlled by $\overline{b0}$. The drains of all of the non-inverting differential transistors 105 and 107 are connected such that the non-inverting currents are summed together and forced through the resistor 109 to create the output voltage $V_{OUT}$ 111. Similarly, all of the inverting differential transistor drains 106 and 108 are connected such that their output currents are summed and are forced across the resistor 110 to create the inverted output voltage $\overline{V_{OUT}}$ 112. Because the total amount of current carried through all of the weighted current slave transistors 103 and 104 is constant, the sum of the voltages $V_{OUT}$ 111 and $\overline{V_{OUT}}$ 112 is a constant.

If the current characteristic of a saturated MOS transistor were not dependent upon the source to drain voltage, then the configuration shown in FIG. 1 would be adequate and would be highly accurate and precise. However, saturated MOS transistors are non-ideal current sources and are more accurately characterized with the Shichman-Hodges model given by the following equation.

$$I_D = \frac{1}{2} \mu_o C_{ox} \frac{W}{L} (V_{gs} - V_t)^2 \cdot (1 + \lambda V_{ds}) \quad (1)$$

If it is assumed that the variations in mobility ($\mu_o$), gate-to-source voltage ($V_{gs}$), threshold voltage ($V_t$), and capacitance per unit area ($C_{ox}$) effects are negligible compared to the other parameters, then the above equation demonstrates that the current is primarily dependent on the W/L ratio of the transistor. For precise current matching, equally important is the incremental change in the output current to an incremental change to the drain-to-source voltage, which is more commonly referred to as the output resistance $r_o$. The output resistance of a MOS transistor in its forward active region is much less than the output resistance of the same transistor in its linear region. In the above equation, $\lambda$ is the channel length modulation factor.

In the conventional configuration illustrated in FIG. 1, the reference current transistor and the transistors carrying the binary weighted currents can experience $V_{ds}$ variations of several volts thus compromising the digital to analog converter accuracy to no better than 8 bits because the binary-weighted currents are no longer properly matched. The $V_{ds}$ variations will vary with different values of R1 and R2, Vdd, and $I_{REF}$. Although an ideal value for the load resistors is 75 Ω, in practice, these resistances can vary from 50–125 Ω. Variations in the output resistances R1 and R2 nearly proportionally change the induced voltage at the outputs 111 and 112. Thus, drain voltage changes for transistors 103 and 104 are caused as explained below.

Because $V_{ds}$ of the differential transistors is less than $V_{gs}-V_t$ for these transistors, the selected differential transistors are operating in the linear region, while the non-selected differential transistors are operating in cutoff. In the linear region, the behavior of a MOS transistor is controlled by the following equation.

$$I_D = \mu_o C_{ox} \frac{W}{L} \left[ (V_{gs} - V_t)V_{ds} - \frac{V_{ds}^2}{2} \right] \quad (2)$$

Typically, $V_{ds}$ for the selected differential transistors is approximately a constant and is relatively small. $V_{ds}$ for the selected differential transistor assumes a level appropriate to satisfy the above equation so that the drain current equals the binary weighted current for the relevant current switching stage. Because the selected differential transistors are in the linear region and $V_{ds}$ for the selected differential transistor is approximately constant, variations in the output voltages 111 and 112 are directly reflected as changes in the voltage at the drains of the saturated binary weighted current slave transistors 103 and 104. Because the saturated binary weighted current slave transistors 103 and 104 have a $V_{ds}$ dependency as described by the Schichman-Hodges model, the variations in the induced output voltages at 111 and 112 alter the magnitudes of the precisely matched binary weighted current slave transistors 103 and 104. These variations in the binary weighted current slave transistors results in gain errors because the binary weighted current slave transistors are no longer in the proper proportions to the reference current $I_{REF}$.

Furthermore, the accuracy of the outputs of the circuit illustrated in the basic topology shown in FIG. 1 is compromised severely with variations in the supply voltage Vdd.

This power supply variation induced output error is due to the changes in $V_{ds}$ of the binary weighted current slave transistors 103 and 104. Moreover, variations in $I_{REF}$ 101 compromise the accuracy of the outputs 111 and 112 beyond 6–8 bits of precision due to the fact that as $I_{REF}$ varies, so does the output current being summed by R1 109 and R2 110. The resulting error in the induced output voltages 111 and 112 are then reflected as errors in $V_{ds}$ of the binary-weighted current slave transistors 103 and 104.

As is apparent from the above discussion, a need exists for a high-precision, high speed, low power digital to analog converter which is immune to output errors created by non-ideal output resistances and fluctuations in power supply or reference currents.

SUMMARY OF THE INVENTION

In conventional current summing digital to analog conversion, the precise matching of the currents is the limiting factor in the accuracy of the converter. In practice, this configuration offers a maximum of 8 bits of resolution. Charge redistribution type converters achieve accuracy up to 12 bits, but are limited to only several megahertz and are, therefore, not practical for video applications.

One object of the present invention is providing a high precision digital to analog converter compatible with low voltage operation. In the presently preferred embodiment using modern process parameters, the resolution is 10 bits using a 3 volt supply. Another object of the present invention is to provide a high speed digital to analog converter suitable for video applications.

According to the present invention, an operational amplifier in a bias voltage generator of a MOS current summing digital to analog converter corrects deviations in output current due to variations in drain to source voltages in current slaves caused by differing output resistances and supply voltages. Matching of MOS current sources uses an operational amplifier feedback circuit to create a controlled turn-on reference voltage used for biasing selected differential current paths so as to eliminate drain to source voltage variations in precisely ratioed current slave MOS transistors.

One transistor of each differential current pair is enabled by a corresponding switch coupled to the turn-on reference voltage produced by the operational amplifier. In the preferred embodiment of the differential current switching stage, the switches are CMOS transmission gates enabled by the binary digital input and its complement. In an alternative embodiment of the differential current switching stage, the switches are simpler single transistor pass gates.

Low voltage (3 volts) operation is achieved by having minimum number of stacked transistors between power supply voltages. Reliable current matching allows converter resolution of 10 bits. Due to cascode switching action controlling alternative differential current paths, output current is independent of the load resistance at the output. The precisely ratioed current slave transistors are maintained in a saturated state, independently of load, so that the dependency of the output current to the drain to source voltage is minimized.

The operational amplifier samples the current bias reference used to bias the binary ratioed slaves and the drain of a current mirror and drives a feedback transistor gate and the enabled differential current paths with the turn-on reference voltage so that the precisely ratioed current slaves have the same drain to source voltage as the reference current transistor. The reference voltages produced are thereby independent of supply voltages and process.

These and other features and advantages of the present invention will be apparent from Detailed Description of the Invention in conjunction with the Figures, in which like reference numerals indicate like parts.

BRIEF DESCRIPTION OF THE DRAWINGS

FIG. 1 illustrates a conventional MOS current summing digital to analog converter.

FIG. 2 illustrates a five-bit current summing digital to analog converter according to the present invention.

FIG. 3 illustrates a MOS current summing digital to analog bias voltage generator according to the presently preferred embodiment of an aspect of the present invention.

FIG. 4 illustrates a MOS current summing digital to analog converter stage according to the preferred embodiment of another aspect of the present invention.

FIG. 5 illustrates an operational amplifier used in the presently preferred embodiment of the MOS current summing digital to analog bias voltage generator according to an aspect of the present invention.

FIG. 6 illustrates an n-bit MOS current summing digital to analog converter circuit according to the present invention.

The Detailed Description of the Invention fully describes the Figures in the context of the present invention.

DETAILED DESCRIPTION OF THE INVENTION

The digital to analog converter circuits according to the present invention are relatively immune to variations in supply voltage Vdd and reference current $I_{REF}$. The matching of the binary-weighted MOS current sources to the current reference source $I_{REF}$ is greatly improved over the prior art. The present invention uses a feedback circuit having an operational amplifier to force the drain voltages of the binary weighted current sources to equal that of the reference current transistor.

Figure 1:
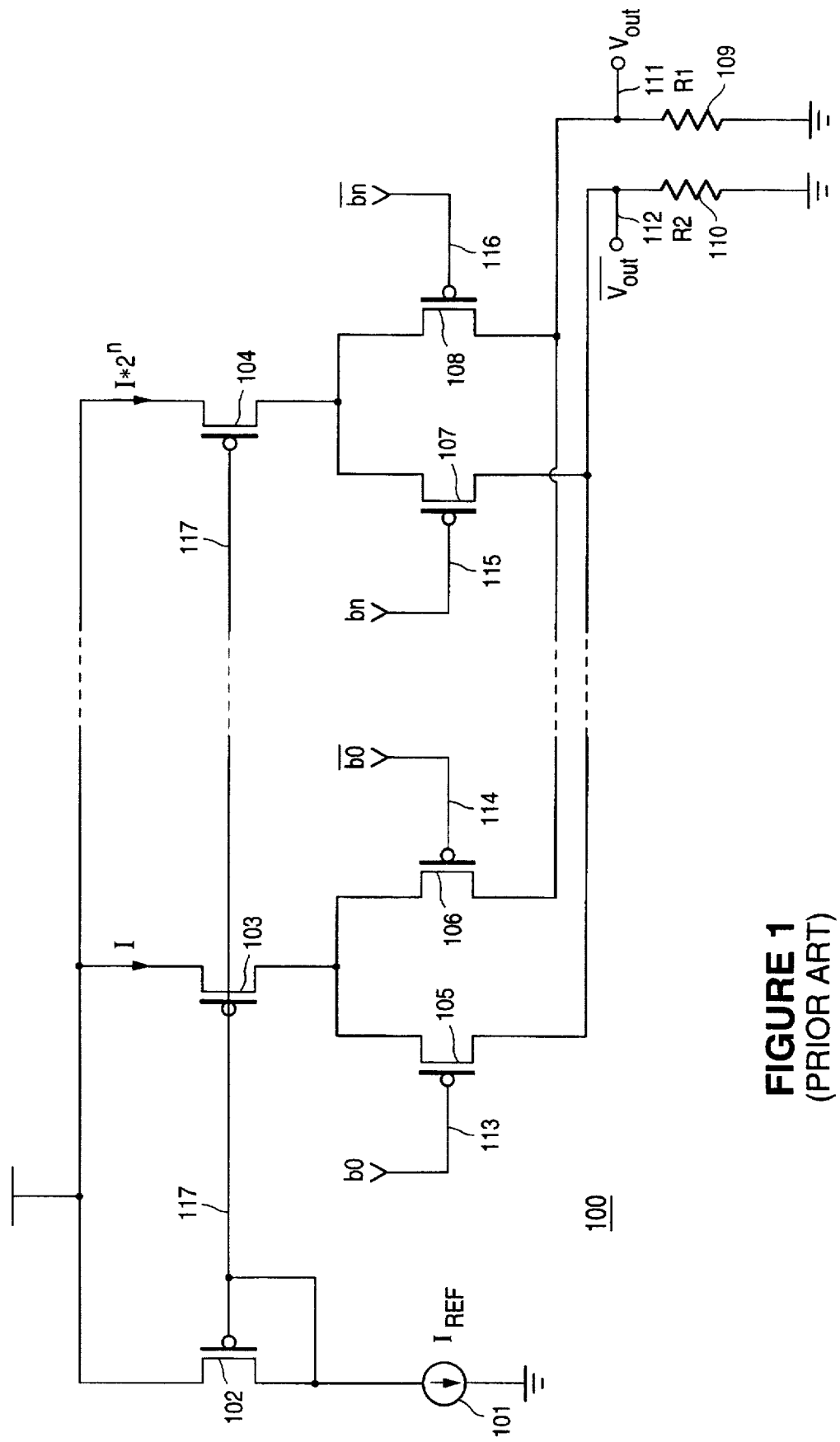
In FIGS. 1 through 6, like numerals label like parts.
Figure 2:
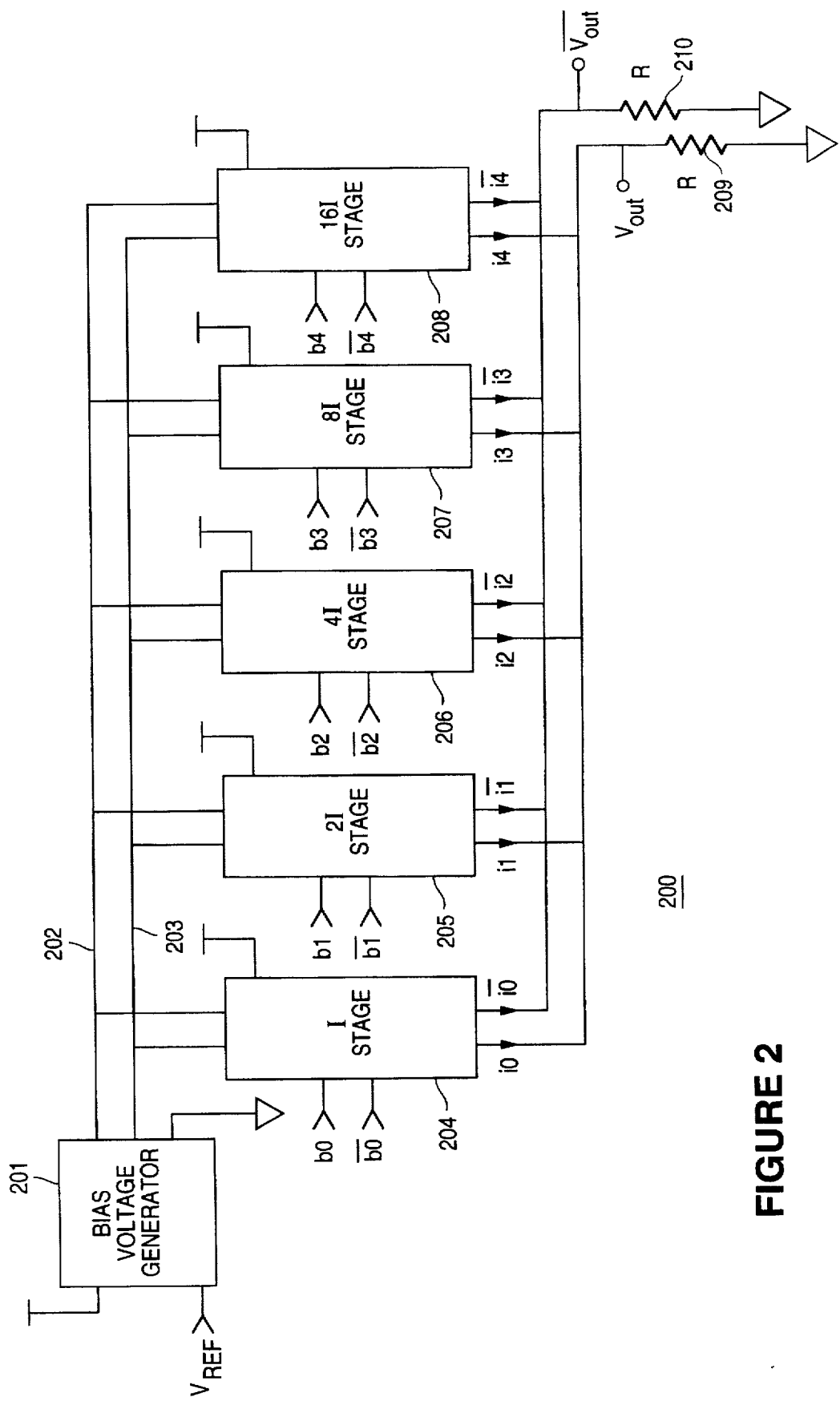

FIG. 2 illustrates the architecture 200 of a MOS current summing digital to analog converter circuit according to the present invention. A bias voltage generator 201 produces a current bias reference output 202 and a turn on reference output 203 which are each routed to each of the current switching stages 204, 205, 206, 207 and 208. The bias voltage generator has power supply voltages of positive Vdd and ground. A reference voltage $V_{REF}$ is input into the bias voltage generator 201 to create the reference current used to generate the output reference voltages 202 and 203. Each converter current switching stage 204, 205, 206, 207 and 208 has only a Vdd positive power supply input. The primary architectural difference between the MOS current summing digital to analog converter 200 according to the present invention and the conventional converter 100 depicted in FIG. 1 is the inclusion of the second reference voltage 203 routed to each current switching stage. Specifically, the turn on reference output 203 of the bias voltage generator is unique to the architecture 200 of the MOS current summing digital to analog converter 200 according to the present invention.

Figure 3:
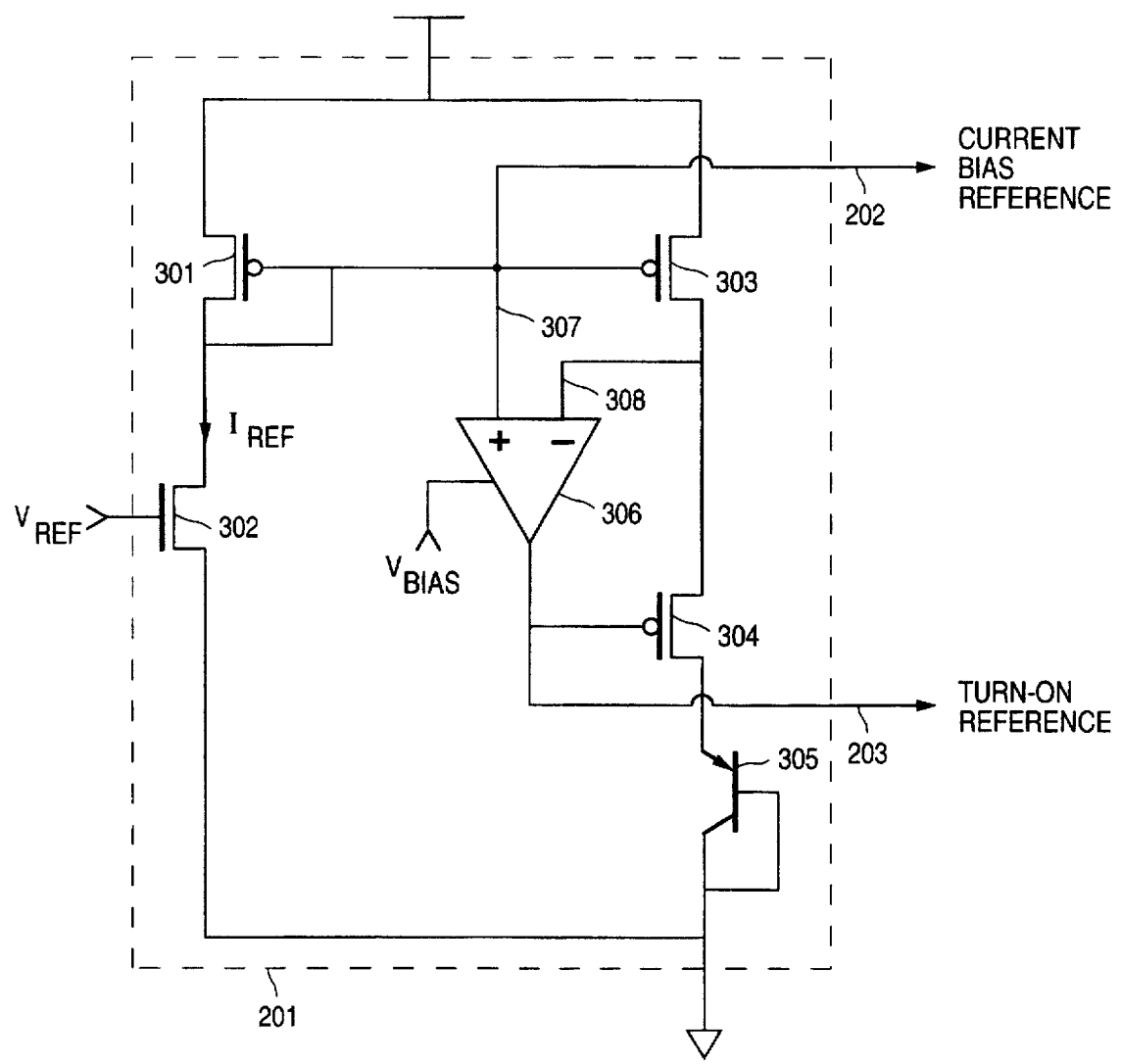

FIG. 3 illustrates the presently preferred embodiment of the bias voltage generator 201 illustrated in FIG. 2 according to the present invention. The bias voltage generator includes a reference current transistor 301 which is driven by a reference current $I_{REF}$ that is produced by applying a reference voltage $V_{REF}$ to the gate of a generator bias transistor 302. A current mirror transistor 303 is biased by the current bias reference voltage 202. The current mirror transistor 303 drives the source of a feedback transistor 304 which drives the emitter of a diode-connected PNP bipolar current mirror sink transistor 305. An operational amplifier 306 drives the gate of the feedback transistor 304 and supplies the turn on reference voltage 203. The plus input of the operational amplifier 306 is connected to the current bias reference 202 while the minus input is connected to the drain of the current mirror transistor 303.

According to ideal operational amplifier theory, because the current into the operational amplifier plus input 307 and the current through the operational amplifier minus input 308 are approximately zero, the drain current through the current mirror transistor 303 and the drain current through the feedback transistor 304 are equal and are independent of circumstances outside the bias voltage generator 201. For example, referring to FIG. 2, regardless of the size of the resistances 209 and 210 or the magnitudes of the currents i0 through i4 or their complements, the drain currents through the current mirror transistor 303, the feedback transistor 304, and the current mirror sink transistor 305 are constant regardless of the circuit conditions in the current switching stages 204 through 208.

Figure 4:
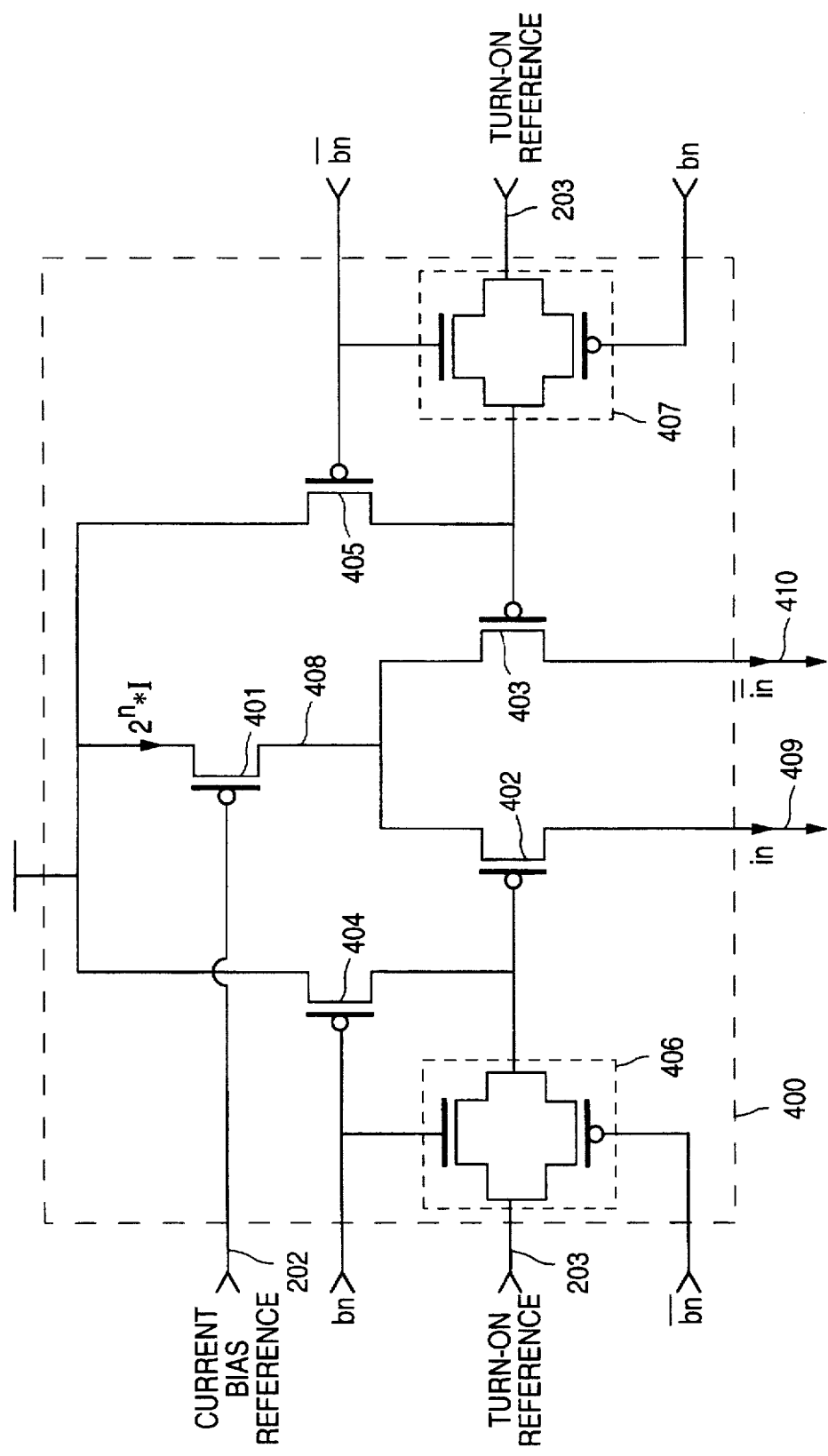

FIG. 4 illustrates a MOS current summing digital to analog converter stage 400 according to the presently preferred embodiment of the present invention. The non-inverting differential transistor 402 and the inverting differential transistor 403 have gate terminals which are carefully controlled. When the non-inverting differential transistor 402 is not selected to conduct the bias current carried through the current slave transistor 401, a non-inverting turn off transistor 404 pulls up the gate of the non-inverting differential transistor 402. Similarly, when the inverting differential transistor 403 is not selected, an inverting turn off transistor 405 turns off the inverting differential transistor 403. The non-inverting 404 and inverting 405 turn off transistors are controlled at their respective gates by the binary digital input bn and its logical compliment $\overline{bn}$.

The terms "non-inverting" and "inverting" as used herein are merely to distinguish between two circuit elements which while otherwise similar to one another are nonetheless distinct from one another inasmuch as they are associated with, process or are controlled by, the non-inverted binary digital input bn and its logical complement (i.e., the inverted binary digital input) $\overline{bn}$, respectively. Hence, for example, transistors 402 and 403, which are interconnected in a differential configuration, are identified as "non-inverting differential transistor 402" and "inverting differential transistor 403," respectively, and transistors 404 and 405, which are used to turn off transistors 402 and 403, are identified as "non-inverting turn off transistor 404" and "inverting turn off transistor 405," respectively.

Because the binary digital input and its compliment are used to enable the non-inverting 404 and inverting 405 turn off transistors, one of the non-inverting and inverting 405 turn off transistors is always enabled so as to pull up the gate of one of the differential transistors 402 and 403 so that one of the differential transistors 402 and 403 is disabled. It is desirable to enable the selected differential transistor 402 or 403 so that the entire current $2^n * I$ flowing throughout the weighted current slave transistor 401 is switched to the proper output node 409 or 410. To this end, a non-inverting turn on switch 406 is used to enable the non-inverting differential transistor 402 by connecting the turn on reference voltage 203 to the gate of the non-inverting differential transistor 402. Similarly, an inverting turn on switch 407 is used to selectively connect the turn on reference voltage 203 generated by the operational amplifier 306 to the gate of the inverting differential transistor 403.

Figure 6:
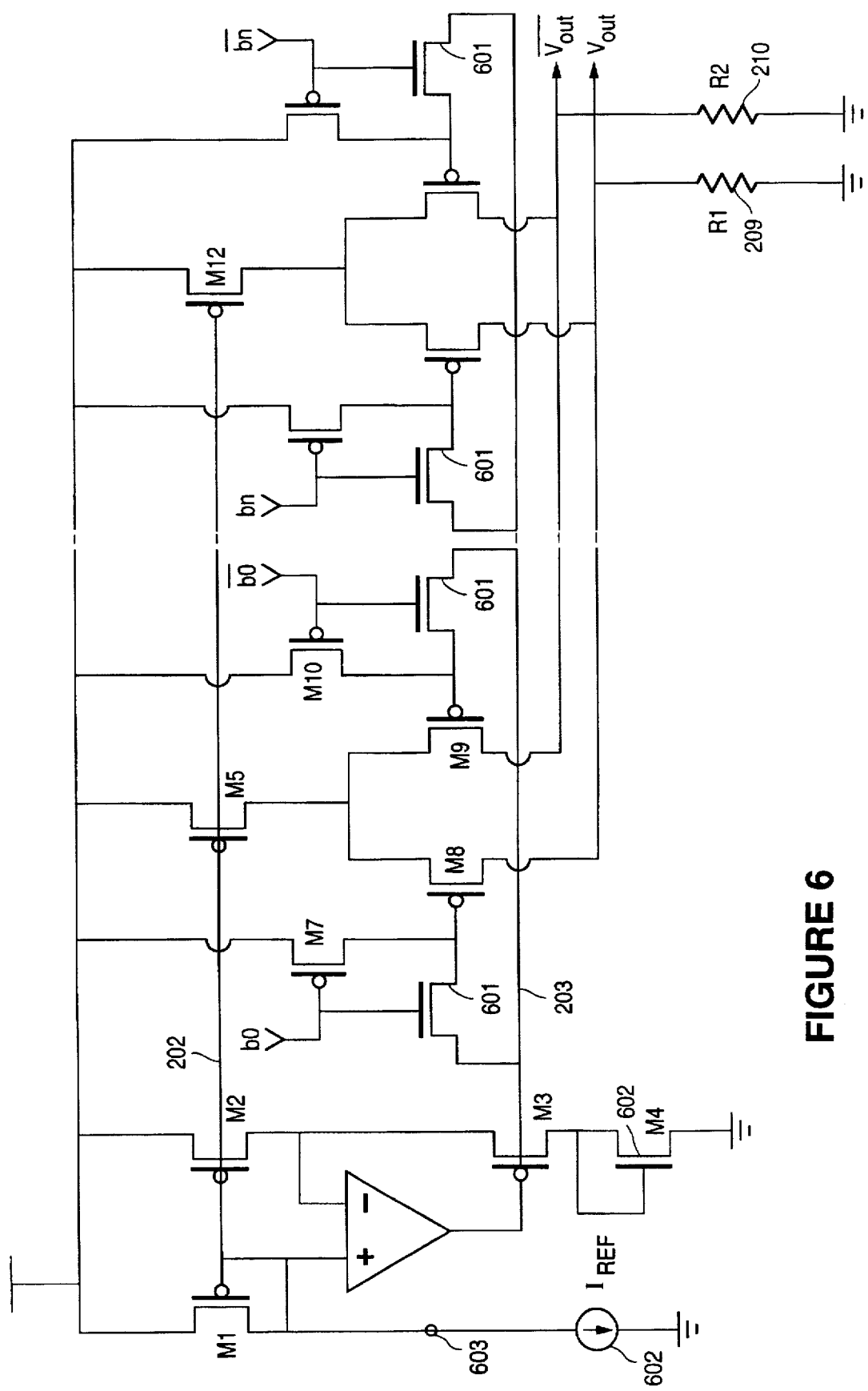

In the preferred embodiment, the turn on switches 406 and 407 are implemented with CMOS transmission gates. The complementary control necessary for the CMOS transmission gates 406 and 407 is easily facilitated by the fact that both the inverting $\overline{bn}$ and non-inverting bn binary digital inputs are supplied to each current switching stage 400. However, there is no requirement that a transmission gate be used as the turn on switches 406 or 407. For example, as illustrated in FIG. 6, the turn on switches can be implemented as simple single-transistors pass gates 601 rather than transmission gates. In either case, the gate voltage of the selected differential transistor 402 or 403 is equal to the turn on reference voltage 203. When one of the differential transistors 402 or 403 is enabled, one of the turn on switches 406 and 407 is enabled such that the gate of the selected differential transistor 402 or 403 is controlled with the turn on reference voltage 203 while the other differential transistor 402 or 403 is turned off.

The result is that the current reference transistor 303 in the FIG. 3 is biased under the same circuit conditions as the weighted current slave transistor 401 in FIG. 4. In other words, the voltages at the gates, drains, and sources of the current reference transistor 301 and the weighted current slave transistors 401 are equal.

Similarly, the feedback transistor 304 in FIG. 3 is biased in the same way as the selected differential transistor 402 or 403. Because the current mirror transistor 303 and feedback transistor 304 in FIG. 3 are under identical conditions as the weighted current slave transistor 401 and the selected differential transistor 402 or 403 in FIG. 4, the drain 408 of the weighted current slave transistor 401 is at the exact same voltage as the drain of the current mirror transistor 303 in FIG. 3 which is connected to the operational amplifier minus input 308. Furthermore, ideal operational amplifier theory requires that the plus input and minus input to the operational amplifier are approximately equal for operational amplifier output voltages within the operational amplifier's forward active region.

Thus, in FIG. 3, the voltage at the minus input 308 is approximately the same as the voltage at the plus input 307 of the operational amplifier 306. In order to drive the drain of the current mirror transistor 303 shown in FIG. 3 such that the minus input 308 of the operational amplifier 306 is the same as the plus input 307, the operational amplifier 306 must produce a turn on reference voltage 203 which is just the right voltage to bias the feedback transistor 304 enough such that the gate and drain of the current mirror transistor 303 are exactly equal.

Since the selected differential transistor 402 or 403 is also controlled by the turn on reference voltage 203, the drain 408 of the weighted current slave transistor 401 equals the voltage of the minus input 308 of the operational amplifier 306. Therefore, the biasing of the weighted current slave transistors is independent of the resistances to which the outputs 409 and 410 in FIG. 4 are connected.

Figure 5:
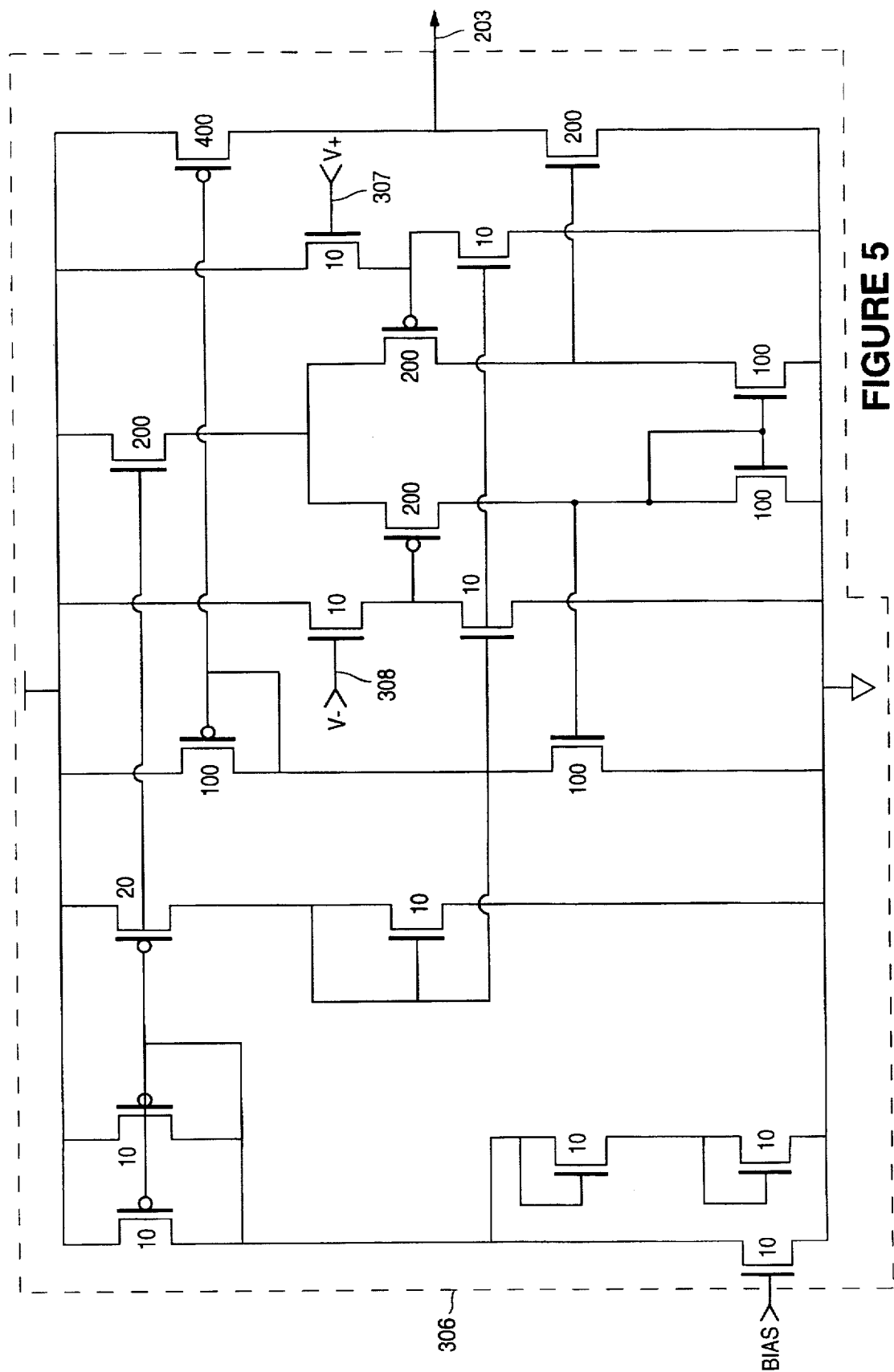

FIG. 5 illustrates the operational amplifier 306 as it is implemented in the presently preferred embodiment of the present invention. In FIG. 5, the presently preferred transistor W/L ratios are listed beside each of the transistors. The power supplies for the operational amplifier 306 are Vdd and ground similar to the rest of the circuit as shown, for example, in FIG. 2; therefore, no supply voltage higher than Vdd or lower than ground is required by the operational amplifier 306. The operational amplifier 306 is controlled by a voltage $V_{BIAS}$ which provides bias current to the rest of the circuit 306. The operational amplifier 306 illustrated in FIG. 5 is carefully implemented such that there are as few stacked transistors as is practical, so that the same low power supply voltages are used to power the operational amplifier 306 as are used to power the rest of the digital to analog converter circuit. A power supply voltage of 3 volts is compatible with the circuits of the present invention.

FIG. 6 illustrates an embodiment of the present invention which contrasts with the prior art circuit 100 as shown in FIG. 1. In FIG. 6 the turn on switches 601 are implemented with n-channel pass transistors 601 rather than CMOS transmission gates 406 and 407 as illustrated in FIG. 4. FIG. 6 also illustrates that the current mirror sink transistor 602 can be implemented with a diode-connected n-channel MOS transistor 602 rather than a diode connected PNP bipolar transistor 305 as illustrated in FIG. 3. The reference current $I_{REF}$ 602 can be generated outside the digital to analog converter circuit and connected to an input pin rather than being generated internally as illustrated by the transistor 302 in FIG. 3. In FIG. 6, the reference current $I_{REF}$ 602 is generated outside the digital to analog converter circuit and is connected to an input terminal 603 designed for providing the bias current.

The reference current, $I_{REF}$ 602, flows through M1 establishing the current bias reference line 202. This reference line 202 is fed to all the binary-weighted current slave transistors. In the diagram, M5 is only one of many currents which are summed to form the digital to analog converter as shown. In order to keep the drain voltage of M5 constant, the gates of M8 or M9 must be driven with controlled voltages. If standard logic voltages are used, the drain voltage of M5 will vary by several volts and result in uncontrollable current variations in M5 as discussed above. The resulting uncontrolled current results in matching degradation of the binary weighted slave currents which lead to resolution error in the digital to analog converter.

The primary purpose of this invention is to present a circuit which keeps the drain of M5 tracking the drain of M1. Once this is accomplished, the precise ratioing of the weighted currents is primarily dependent on the gate areas of the binary weighted devices and not on the drain to source voltages $V_{ds}$ of the weighted current slave transistors as in the prior art approach. In the following explanation on the operations of the proposed circuit, it is assumed that the ratioing of the channel W/L contributes no errors to the output. The circuit shown in FIG. 6 then works in the following manner. Transistors M1 and M2 are matched, and the W/L parameter of transistor M5 is ratioed to the W/L parameter of transistor M2. Transistors M1, M2, and M5 all have equal gate, source, and drain voltages. Transistor M3 and one of transistors M8 and M9 (the enabled one) have equal gate, source, and drain voltages. Transistors M2, M3, and M4 form a current path which simulates the voltage drops along each of the current switching stages.

The goal is to establish a turnon reference voltage which is independent of the power supply voltage Vdd and the process parameters, which is used to bias the current switches M8 and M9. To establish this voltage, a feedback loop utilizing an operational amplifier is incorporated. The operational amplifier samples both the current bias reference node 202 and the drain of M2 and uses M3 as its feedback path to control the voltage at the drain of M2 since the feedback transistor M3 serves as a source follower. When the operational amplifier is operating in its forward active region, V+ and V− of the operational amplifier are equal

9 according to the ideal operational amplifier theory. The output of the operational amplifier settles to the correct voltage that forces $V_{ds1}$ of transistor M1 and $V_{ds2}$ of transistor M2 to be equal. This operational amplifier output 203 is then used to enable the selected differential transistors in the various binary-weighted current branches of the digital to analog converter array. Because the turnon reference signal 203 is controlled and is less than the positive supply voltage Vdd, the selected differential transistor (either M8 or M9) remains in the saturation region rather than the being permitted to drift into the linear region; therefore, its drain current dependency on $V_{ds}$ is minimized.

The circuit operates independent of supply voltage and process and is fully compatible with 3 volts operation. Because M5 and M12 stay in the saturation region due to the cascode switching action of M8 and M9, the binary weighted currents (I, $2^n$*I, etc.) are not dependent on the output load resistors R1 and R2. The gain error with respect to $I_{REF}$, which occurs due to $V_{ds}$ variations in M5, M12, etc. is also eliminated.

In order for the circuits according to the present invention to function properly, the operational amplifier's gain must be high enough to correct the mismatch in the bias voltage developed at the output of the operational amplifier. In other words, the operational amplifier's gain must be high enough to force v− of the operational amplifier to the same voltage as v+ within a given precision. As a general rule, the gain of the operational amplifier should be as high as the number of bits of precision desired from the digital to analog converter. For example, a 10 bit system should have at least 60 dBs of open loop gain. This is based on the assumption that each input bit provides about 6 dBs of dynamic range. The output of the operational amplifier labelled node 203 then is the correct voltage that when presented to the gates of M3, M8, M9, etc. will set the voltage properly at the drain of M5 (and other related devices) as the same voltage which is on the drain of M1, the reference transistor.

The present invention virtually eliminates the $V_{ds}$ mismatch problem. Because of its low number of stacked transistors, it is 3 volt compatible. This is primarily due to the combined multifunction cascode-switch which is formed by M8 and M9.

Those of ordinary skill in the art would be enabled by this disclosure to add to or modify the embodiment of the present invention in various ways as needed and still be within the scope and spirit of various aspects of the present invention. Accordingly, various changes and modifications which are obvious to a person skilled in the art to which the invention pertains are deemed to lie within the spirit and scope of the invention.

What is claimed is:

1. A MOS current-summing digital-to-analog converter bias voltage generator having a current bias reference output and a turnon reference output, the generator comprising:

a reference current transistor of a first conductivity type having a reference current source, a reference current gate, and a reference current drain;

a current mirror transistor of the first conductivity type having a current mirror source, a current mirror gate, and a current mirror drain;

an operational amplifier having a plus input, a minus input, and an operational amplifier output; and a feedback transistor of the first conductivity type having a feedback source, a feedback gate, and a feedback drain;

wherein the operational amplifier plus input is coupled to the current mirror gate, and the reference current gate and drain, and the current bias reference output; and

10 wherein the feedback gate is coupled to the operational amplifier output and the turnon reference output, and wherein the feedback source is coupled to the operational amplifier minus input and the current mirror drain.

2. A MOS current-summing digital-to-analog converter bias voltage generator as in claim 1, further comprising:

a generator bias transistor of a second conductivity type having a generator bias drain, a generator bias source, and a generator bias gate;

wherein the generator bias drain is coupled to the operational amplifier plus input, and the generator bias gate is coupled to an input reference voltage.

3. A MOS current-summing digital-to-analog converter bias voltage generator as in claim 2, further comprising:

a current mirror sink transistor of the second conductivity type having a current mirror sink gate, a current mirror sink drain, and a current mirror sink source, wherein the current mirror sink drain is coupled to the current mirror sink gate and the feedback drain.

4. A MOS current-summing digital-to-analog converter bias voltage generator as in claim 2, wherein the first conductivity type is p-channel MOS and the second conductivity type is n-channel MOS.

5. A MOS current-summing digital-to-analog converter bias voltage generator as in claim 4, further comprising:

a pnp bipolar current mirror sink transistor having a current mirror sink base, a current mirror sink collector, and a current mirror sink emitter; and wherein the current mirror sink emitter is coupled to the feedback drain, and the current mirror sink collector is coupled to the current mirror sink gate.

6. A MOS current-summing digital-to-analog converter bias voltage generator as in claim 5, wherein a ground voltage is coupled to the generator bias source and the current mirror sink base and collector.

7. A MOS current-summing digital-to-analog converter bias voltage generator as in claim 5, wherein a positive supply voltage is coupled to the reference current source and the current mirror source.

8. A MOS current-summing digital-to-analog converter circuit having first and second non-inverting and inverting binary weighted digital inputs and non-inverting and inverting analog output voltages, comprising:

a reference current transistor of a first conductivity type having a reference current source, a reference current gate, and a reference current drain;

a current mirror transistor of the first conductivity type having a current mirror source, a current mirror gate, and a current mirror drain;

an operational amplifier having a plus input, a minus input, and an operational amplifier output;

a feedback transistor of the first conductivity type having a feedback source, a feedback gate, and a feedback drain;

a first weighted-current slave transistor of the first conductivity type having a first channel W/L ratio having a first weighted-current slave source, a first weighted-current slave gate, and a first weighted-current slave drain;

a second weighted-current slave transistor of the first conductivity type having a second channel W/L ratio having a second weighted-current slave source, a second weighted-current slave gate, and a second weighted-current slave drain, wherein the second W/L ratio divided by the first W/L ratio is a radix factor not equal to one;

a first non-inverting differential transistor of the first conductivity type having a first non-inverting differential source, a first non-inverting differential gate, and a first non-inverting differential drain;

a first inverting differential transistor of the first conductivity type having a first inverting differential source, a first inverting differential gate, and a first inverting differential drain;

a second non-inverting differential transistor of the first conductivity type having a second non-inverting differential source, a second non-inverting differential gate, and a second non-inverting differential drain;

a second inverting differential transistor of the first conductivity type having a second inverting differential source, a second inverting differential gate, and a second inverting differential drain;

a first non-inverting control transistor of a second conductivity type having a first non-inverting control source, a first non-inverting control gate, and a first non-inverting control drain;

a first inverting control transistor of the second conductivity type having a first inverting control source, a first inverting control gate, and a first inverting control drain;

a second non-inverting control transistor of the second conductivity type having a second non-inverting control source, a second non-inverting control gate, and a second non-inverting control drain; and a second inverting control transistor of the second conductivity type having a second inverting control source, a second inverting control gate, and a second inverting control drain;

wherein the first non-inverting control drain is coupled to the first non-inverting differential gate, wherein the first non-inverting control gate is coupled to the first non-inverting weighted binary digital input, and wherein the first non-inverting control source is coupled to the operational amplifier output;

wherein the first inverting control drain is coupled to the first inverting differential gate, wherein the first inverting control gate is coupled to the first inverting weighted binary digital input, and wherein the first inverting control source is coupled to the operational amplifier output;

wherein the second non-inverting control drain is coupled to the second non-inverting differential gate, wherein the second non-inverting control gate is coupled to the second non-inverting weighted binary digital input, and wherein the second non-inverting control source is coupled to the operational amplifier output;

wherein the second inverting control drain is coupled to the second inverting differential gate, wherein the second inverting control gate is coupled to the second inverting weighted binary digital input, and wherein the second inverting control source is coupled to the operational amplifier output;

wherein the first and second non-inverting differential drains are coupled to the non-inverting analog output voltage;

wherein the first and second inverting differential drains are coupled to the inverting analog output voltage;

wherein the first non-inverting and inverting differential sources are coupled to the first weighted-current slave drain;

wherein the second non-inverting and inverting differential sources are coupled to the second weighted-current slave drain;

wherein the operational amplifier plus input is coupled to the first and second weighted-current slave gates, the current mirror gate, and the reference current gate and drain; and wherein the feedback gate is coupled to the operational amplifier output, and wherein the feedback source is coupled to the operational amplifier minus input and the current mirror drain.

9. A MOS current-summing digital-to-analog converter circuit as in claim 8, further comprising:

a constant current source having an input and output, wherein the constant current source input is coupled to the operational amplifier plus input.

10. A MOS current-summing digital-to-analog converter circuit as in claim 8, further comprising:

a first non-inverting turnoff transistor of the first conductivity type having a first non-inverting turnoff source, a first non-inverting turnoff gate, and a first non-inverting turnoff drain;

a first inverting turnoff transistor of the first conductivity type having a first inverting turnoff source, a first inverting turnoff gate, and a first inverting turnoff drain;

a second non-inverting turnoff transistor of the first conductivity type having a second non-inverting turnoff source, a second non-inverting turnoff gate, and a second non-inverting turnoff drain; and a second inverting turnoff transistor of the first conductivity type having a second inverting turnoff source, a second inverting turnoff gate, and a second inverting turnoff drain;

wherein the first non-inverting turnoff gate is coupled to the first non-inverting binary weighted digital input, wherein the first non-inverting turnoff drain is coupled to the first non-inverting differential gate;

wherein the first inverting turnoff gate is coupled to the first inverting binary weighted digital input, wherein the first inverting turnoff drain is coupled to the first inverting differential gate;

wherein the second non-inverting turnoff gate is coupled to the second non-inverting binary weighted digital input, wherein the second non-inverting turnoff drain is coupled to the second non-inverting differential gate; and wherein the second inverting turnoff gate is coupled to the second inverting binary weighted digital input, wherein the second inverting turnoff drain is coupled to the second inverting differential gate.

11. A MOS current-summing digital-to-analog converter circuit as in claim 8, further comprising:

a current mirror sink transistor of the second conductivity type having a current mirror sink gate, a current mirror sink drain, and a current mirror sink source, wherein the current mirror sink drain is coupled to the current mirror sink gate and the feedback drain.

12. A MOS current-summing digital-to-analog converter circuit as in claim 8, further comprising:

a non-inverting output resistor; and an inverting output resistor;

wherein the non-inverting output resistor is coupled to the non-inverting analog output voltage; and wherein the inverting output resistor is coupled to the inverting analog output voltage.

13. A MOS current-summing digital-to-analog converter circuit as in claim 10, wherein the first conductivity type is p-channel MOS and the second conductivity type is n-channel MOS.

14. A MOS current-summing digital-to-analog converter circuit as in claim 13, wherein a positive supply voltage is coupled to the reference current source, the current mirror source, the first and second weighted-current slave sources, and the first and second non-inverting and inverting turnoff sources.

15. A MOS current-summing digital-to-analog converter circuit as in claim 10, wherein the first conductivity type is n-channel MOS and the second conductivity type is p-channel MOS.

16. A MOS current-summing digital-to-analog converter circuit as in claim 15, wherein a ground voltage is coupled to the reference current source, the current mirror source, the first and second weighted-current slave sources, and the first and second non-inverting and inverting turnoff sources.

17. A MOS current-summing digital-to-analog converter circuit as in claim 8, wherein the first inverting and non-inverting differential transistors have a first differential W/L parameter;

wherein the second inverting and non-inverting differential transistors have a second differential W/L parameter;

such that the second differential W/L parameter divided by the first differential W/L parameter is equal to the radix factor.

18. A MOS current-summing digital-to-analog converter circuit as in claim 8, wherein the radix factor is 2.

* * * * *